United States Patent
Sugimoto et al.

(10) Patent No.: US 10,872,576 B2
(45) Date of Patent: Dec. 22, 2020

(54) DISPLAY DRIVER IC

(71) Applicant: Rohm Co., Ltd., Kyoto (JP)

(72) Inventors: Yasuhito Sugimoto, Kyoto (JP); Sukenori Ito, Kyoto (JP); Hiromitsu Nakaoka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/339,538

(22) PCT Filed: Sep. 6, 2017

(86) PCT No.: PCT/JP2017/032089
§ 371 (c)(1),
(2) Date: Apr. 4, 2019

(87) PCT Pub. No.: WO2018/066292
PCT Pub. Date: Apr. 12, 2018

(65) Prior Publication Data
US 2019/0237033 A1    Aug. 1, 2019

(30) Foreign Application Priority Data
Oct. 5, 2016 (JP) .................................. 2016-197357

(51) Int. Cl.
*G09G 3/18* (2006.01)
*G09G 3/36* (2006.01)
(Continued)

(52) U.S. Cl.
CPC ........... *G09G 3/3648* (2013.01); *G01R 31/28* (2013.01); *G09G 3/04* (2013.01); *G09G 3/18* (2013.01);
(Continued)

(58) Field of Classification Search
CPC .......... G09G 3/3648; G09G 3/04; G09G 3/18; G01R 31/28; H01L 21/822; H01L 27/04
See application file for complete search history.

(56) References Cited

U.S. PATENT DOCUMENTS

| 9,626,929 B2 * | 4/2017 | Yusa ................... G09G 3/3685 |
| 2009/0153541 A1 | 6/2009 | Yusa |
| 2015/0061723 A1 | 3/2015 | Zhang et al. |

FOREIGN PATENT DOCUMENTS

| JP | 2005-134655 | 5/2005 |
| JP | 2005134655 A * | 5/2005 |

(Continued)

OTHER PUBLICATIONS

Japan Patent Office, International Search Report for PCT/JP2017/032089 dated Dec. 12, 2017 with English translation.

*Primary Examiner* — Alexander Eisen
*Assistant Examiner* — Cory A Almeida
(74) *Attorney, Agent, or Firm* — Fish & Richardson P.C.

(57) ABSTRACT

A display driver IC (200) comprises: a digital circuit including a logic circuit (2); an output unit (11) for outputting, to the outside, a drive control signal with a level corresponding to the output from the logic circuit; and at least one of a first decision unit (21) for determining whether or not an abnormality is present in the register value in a register in the digital circuit and a second decision unit (22) for determining whether or not the level of the drive control signal is the level corresponding to the output from the logic circuit.

15 Claims, 7 Drawing Sheets

(51) Int. Cl.
*G01R 31/28* (2006.01)
*H01L 21/822* (2006.01)
*H01L 27/04* (2006.01)
*G09G 3/04* (2006.01)

(52) U.S. Cl.
CPC ............ *H01L 21/822* (2013.01); *H01L 27/04* (2013.01); *G09G 2310/0286* (2013.01); *G09G 2310/0289* (2013.01)

(56) References Cited

FOREIGN PATENT DOCUMENTS

| | | | |
|---|---|---|---|
| JP | 2007-164087 | | 6/2007 |
| JP | 2007164087 A | * | 6/2007 |
| JP | 2008-234511 | | 10/2008 |
| JP | 2008234511 A | * | 10/2008 |
| JP | 2009-145485 | | 7/2009 |
| JP | 2014-032292 | | 2/2014 |
| JP | 2015-049435 | | 3/2016 |

* cited by examiner

DISPLAY DRIVER IC

TECHNICAL FIELD

This invention relates to a display driver IC (integrated circuit) which drives and controls a display panel.

BACKGROUND ART

A display driver IC receives display data transmitted from a host device and drives and controls a display panel based on the received display data.

LIST OF CITATIONS

Patent Literature

Patent Document 1: JP-A-2015-049435

SUMMARY OF THE INVENTION

Technical Problem

Patent Document 1 discloses a display driver IC which is connected by COG (chip on glass) mounting to a plurality of terminals formed on a glass substrate of a display panel and which includes a first bump, a second bump, and a resistance sensing circuit sensing resistance between the first bump and the second bump.

The display driver IC disclosed in Patent Document 1 is COG-mounted on a TFT substrate including first and second terminals which are each connected to the first and second bumps of the display driver IC and a first conductor which connects together the first and second terminals; it is thus easily possible to sense insufficient contact pressure.

However, with the display driver IC disclosed in Patent Document 1, it is impossible to sense abnormalities other than insufficient contact pressure.

Against the background discussed above, an object of the present invention is to provide a display driver IC which can sense a factor causing an abnormality in a drive control signal transmitted to the display panel.

Means for Solving the Problem

According to one aspect of what is disclosed herein, a display driver IC includes: a digital circuit including a logic circuit; an output unit configured to output to outside a drive control signal having a level commensurate with the output of the logic circuit; and at least one of a first decision unit configured to check whether or not there is an abnormality in the register value of a register in the digital circuit and a second decision unit configured to check whether or not the level of the drive control signal is a level commensurate with the output of the logic circuit. (A first configuration.)

In the display driver IC according to the first configuration described above, preferably, the first decision unit is provided, and the first decision unit includes at least one data flip-flop and is configured to determine that there is an abnormality in the register value of the register in the digital circuit when a value written to the data flip-flop does not match a value read from the data flip-flop. (A second configuration.)

In the display driver IC according to the second configuration described above, preferably, the value written to the data flip-flop after the data flip-flop is reset is the inverted value of the value written to the data flip-flop before the data flip-flop is reset. (A third configuration.)

In the display driver IC according to the second or third configuration described above, preferably, the display driver IC is in a rectangular shape in a plan view, and the data flip-flop is provided in each of the four corners of the rectangular shape. (A fourth configuration.)

In the display driver IC according to any one of the second to fourth configurations described above, preferably, there are provided a ground potential terminal connected to a ground potential and a ground potential conductor pattern connected to the ground potential terminal. Here, the data flip-flop is provided near a place with the highest impedance with respect to the ground potential terminal within the ground potential conductor pattern. (A fifth configuration.)

In the display driver IC according to any one of the second to fifth configurations described above, preferably, there are provided a supply voltage terminal to which a supply voltage is applied and a supply voltage conductor pattern connected to the supply voltage terminal. Here, the data flip-flop is provided near a place with the highest impedance with respect to the supply voltage terminal within the supply voltage conductor pattern. (A sixth configuration.)

In the display driver IC according to any one of the first to sixth configurations described above, preferably, the second decision unit is provided, and the level commensurate with the output of the logic circuit has one of three or more values. Here, the second decision unit is configured to sense the level of the drive control signal only when the level commensurate with the output of the logic circuit has one of particular two values to check whether or not the level of the drive control signal is a level commensurate with the output of the logic circuit. (A seventh configuration.)

In the display driver IC according to any one of the first to seventh configurations described above, preferably, there are provided: a third decision unit configured to check whether or not there is an abnormality in data that the logic circuit receives from outside; and a fourth decision unit configured to check whether or not there is a breakage in the display panel to which the display driver IC is connected by COG mounting. (An eighth configuration.)

According to one aspect of what is disclosed herein, a display device includes: a host device; the display driver IC according to any one of the first to eighth configurations configured to receive data from the host device; and a display panel configured to receive a drive control signal from the display driver IC. (A ninth configuration.)

According to one aspect of what is disclosed herein, a vehicle includes the display device according to the ninth configuration described above. (A tenth configuration.)

Advantageous Effects of the Invention

According to the display driver IC disclosed herein, it is possible to sense a factor causing an abnormality in a drive control signal transmitted to the display panel.

DESCRIPTION OF EMBODIMENTS

<Overall Configuration>

Figure 1:
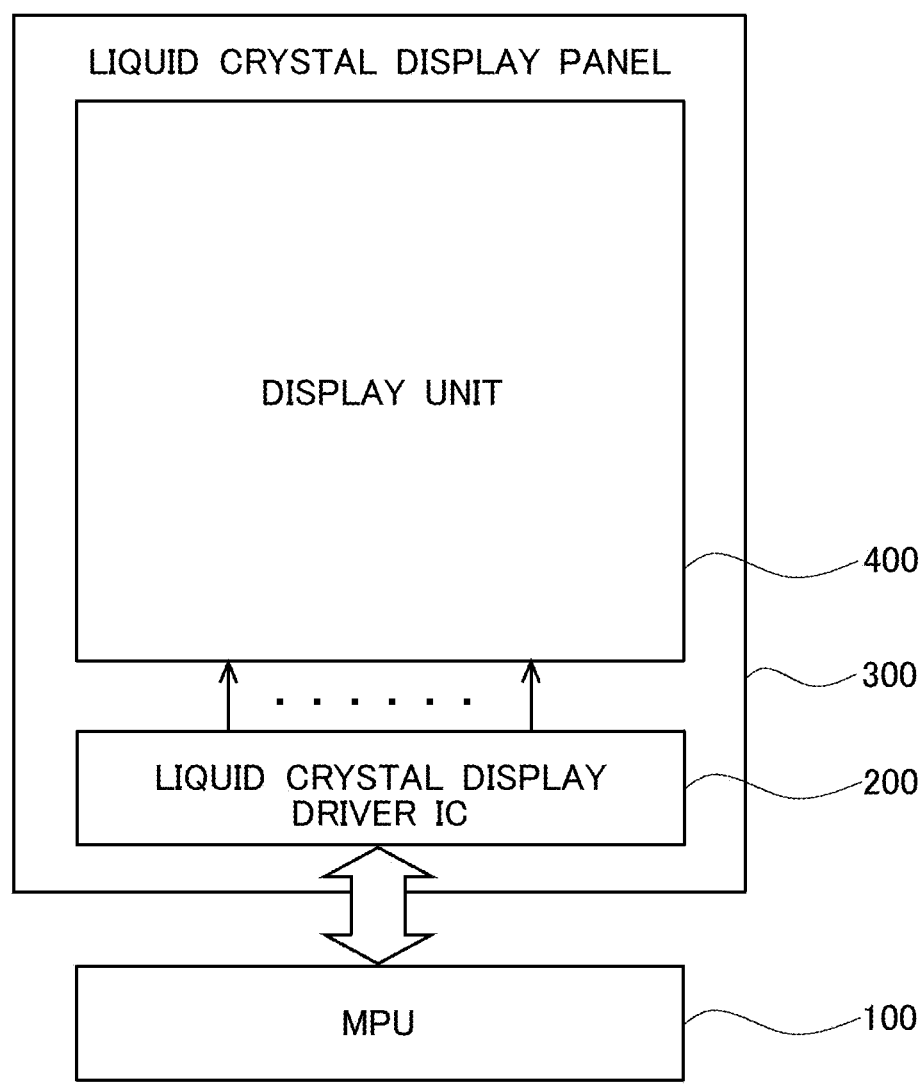
FIG. 1 is a schematic top view of a display device according to one embodiment.

FIG. 1 is a schematic top view of a display device according to one embodiment. The display device shown in FIG. 1 includes a MPU (microprocessing unit) 100 which is a host device, a liquid crystal display driver IC 200 which receives display data from the MPU 100, and a liquid crystal display panel 300 which receives drive control signals (scanning signals COM0 to COM3 and data signals SEG0 to SEG9, which will be described later) from the liquid crystal display driver IC 200.

The liquid crystal display panel 300 has a display unit 400 formed on a glass substrate. The liquid crystal display driver IC 200 is COG-mounted on the glass substrate of the liquid crystal display panel 300 and outputs the drive control signals to the display unit 400.

Figure 2:
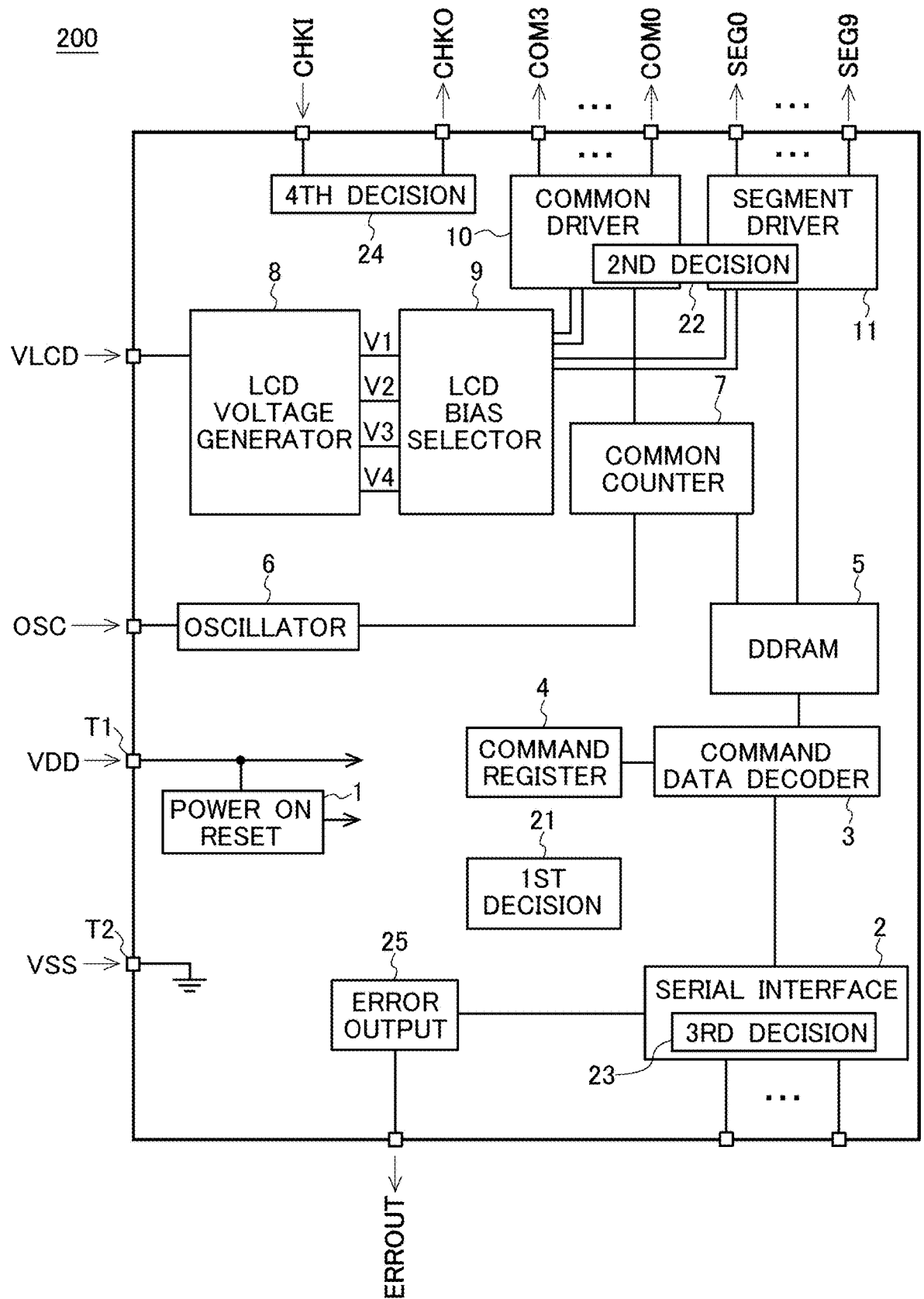
FIG. 2 is a block diagram showing one configuration example of a liquid crystal display driver IC.

FIG. 2 is a block diagram showing one configuration example of the liquid crystal display driver IC 200.

The liquid crystal display driver IC 200 operates on an internal supply voltage which is the difference between a supply voltage VDD applied to a supply voltage terminal T1 and a ground voltage VSS applied to a ground potential terminal T2. When the supply voltage VDD applied to the supply voltage terminal T1 drops, a power-on reset circuit 1 resets the operation of the whole liquid crystal display driver IC 200.

A serial interface 2 performs serial bus communication such as I2C with the MPU 100. The serial interface 2 is a logic circuit and outputs to a command data decoder 3 data received from the MPU 100 while holding it in a register.

The command data decoder 3 decodes, with reference to a register value written to a command resister 4, a command contained in serial data output from the serial interface 2.

The display data contained in the serial data output from the serial interface 2 is output from the command data decoder 3 to a display data RAM (random-access memory) 5.

An oscillator 6 outputs to a common counter 7 an external oscillation signal OSC fed from outside or an internal oscillation signal generated by the oscillator 6 itself oscillating.

The common counter 7 controls a scanning interval based on the external oscillation signal OSC or the internal oscillation signal output from the oscillator 6.

A liquid crystal voltage generator 8 divides a constant voltage VLCD for driving liquid crystal, which is fed from outside, and generates four-value voltages V1 to V4. The voltage values are such that V1>V2>V3>V4. The voltage V1 has the same value as the constant voltage VLCD, and the voltage V4 has the same value as the ground voltage VSS.

A liquid crystal bias selector 9 feeds a voltage selected from the voltages V1 to V4 to a common driver 10 and to a segment driver 11.

The common driver 10 generates the scanning signals COM0 to COM3 by use of the output of the liquid crystal bias selector 9 and outputs them to the display unit 400. The segment driver 11 generates, based on the display data output from the display data RAM 5, the data signals SEG0 to SEG9 by use of the output of the liquid crystal bias selector 9 and outputs them to the display unit 400. Here, the number of scanning signals (four) in this embodiment and the number of data signals (ten) in this embodiment are merely one example; the number of scanning signals and the number of data signals are not limited to those in this embodiment.

First to fourth decision circuits 21 to 24 and an error signal output circuit 25 will be described in detail later.

Figure 3:
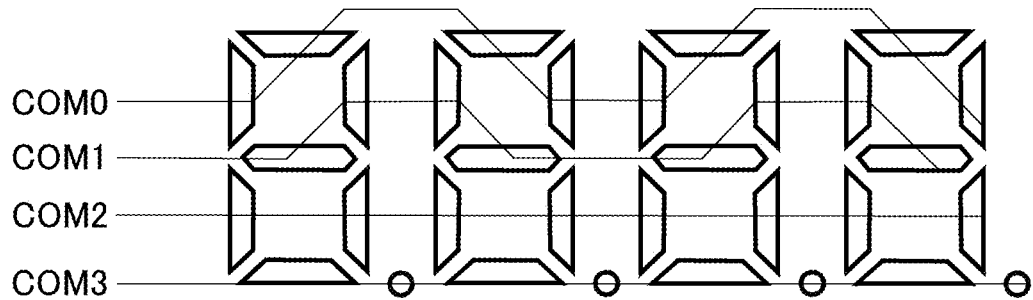
FIG. 3 is a diagram showing an example of a pattern of COM lines.

FIG. 3 is a diagram showing an example of a pattern of COM lines. On the display unit 400, as shown in FIG. 3, four COM lines are arranged to which the scanning signals COM0 to COM3 are fed respectively.

Figure 4:
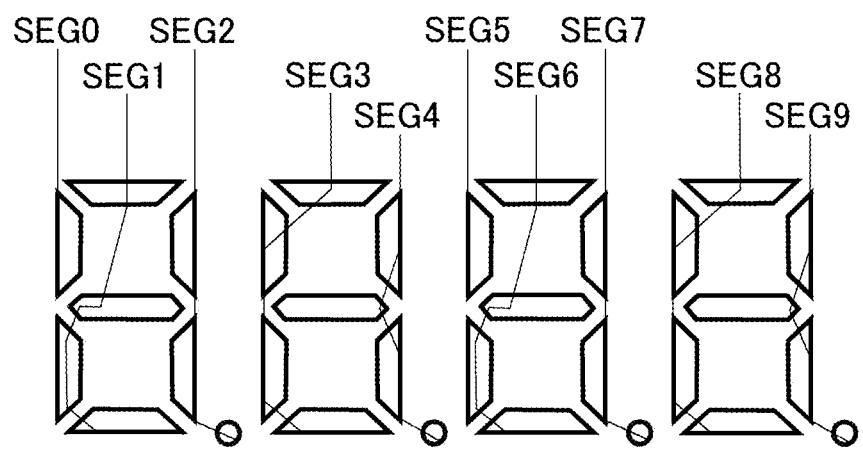
FIG. 4 is a diagram showing an example of a pattern of SEG lines.

FIG. 4 is a diagram showing an example of a pattern of SEG lines. On the display unit 400, as shown in FIG. 4, ten SEG lines are arranged to which the data signals SEG0 to SEG9 are fed respectively.

Figure 5:
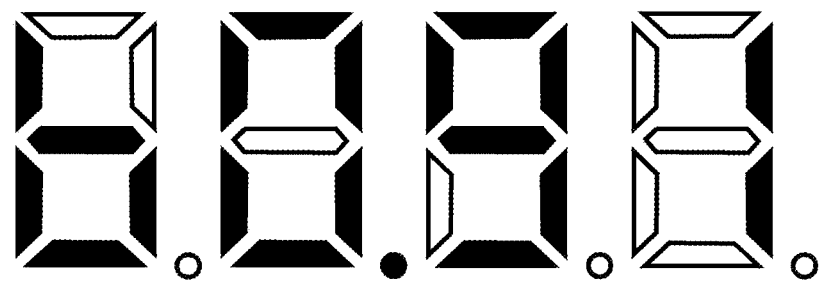
FIG. 5 is a diagram showing an example of a display pattern.

With the example of the pattern of COM lines shown in FIG. 3 and the example of the pattern of SEG lines shown in FIG. 4, it is possible to achieve segment display and thus to achieve display as shown in FIG. 5.

<First Decision Circuit>

A first decision circuit 21 includes a plurality of data flip-flops and checks whether or not there is any abnormality in a register value of a register in a digital circuit. In the configuration example shown in FIG. 2, the serial interface 2, the command data decoder 3, the command resister 4, the display data RAM 5, and the common counter 7 constitute a digital circuit. External electric noise causes an abnormality in the register value of the register in the digital circuit. Thus, the data flip-flops are arranged at positions where they are likely to be affected by external electric noise. When a value (expected value) written to a data flip-flop does not match a value read from the data flip-flop, there is high probability that there is an abnormality in the register value of the register in the digital circuit; thus, the first decision circuit 21 determines that there is an abnormality in the register value of the register in the digital circuit.

The first decision circuit 21 generates data to be written to a data flip-flop and compares the value (expected value) written to the data flip-flop with the value read from the data flip-flop.

Here, a value to be written to the data flip-flop is preferably the inverted value of the value having been written to the data flip-flop before writing. For example, when the first decision circuit 21 sequentially generates data to be written to five data flip-flop, if the data generated first by the first decision circuit 21 is "10101", the data generated by the first decision circuit 21 after the subsequent comparison can be "01010". When a value written to a data flip-flop is fixed, it may inconveniently happen, for example, that the output of a damaged data flip-flop continues to match the value written to the data flip-flop.

Figure 6:
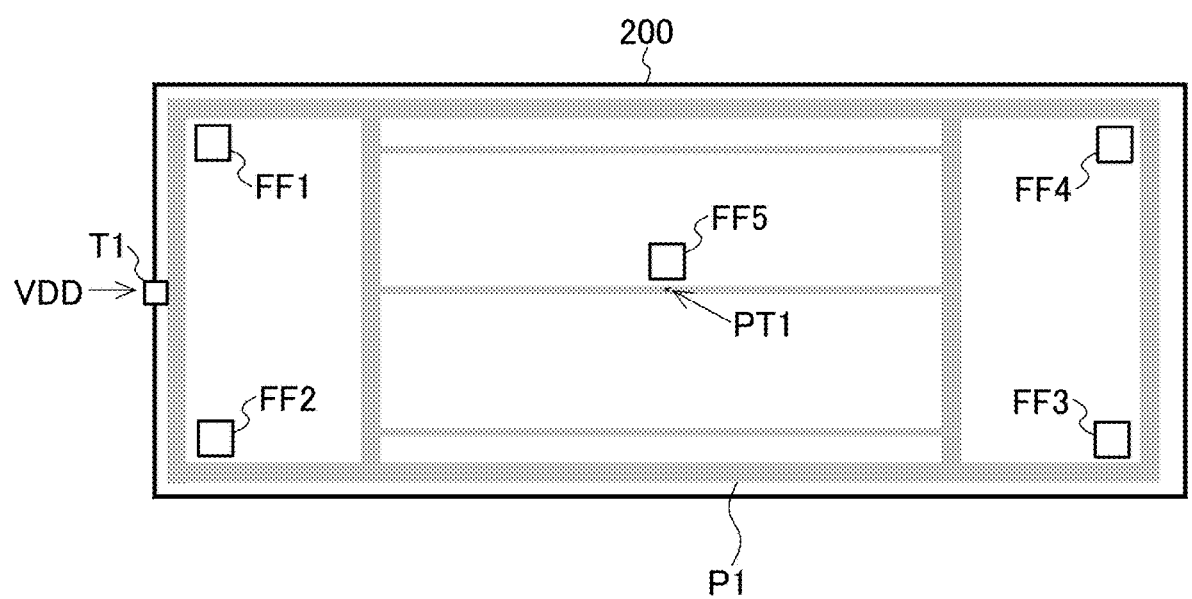
FIG. 6 is a diagram showing an example of an arrangement of data flip-flops.

FIG. 6 is a diagram showing an example of the arrangement of data flip-flops. The liquid crystal display driver IC 200 is rectangular in a plan view, and the data flip-flops FF1 to FF4 are arranged in the four corners of the liquid crystal display driver IC 200. This is because the four corners of the liquid crystal display driver IC 200 are considered to be positions that are most likely to be affected by external electric noise.

Variation in the supply voltage VDD can cause external electric noise. A supply voltage conductor pattern P1 to which the supply voltage terminal T1 is connected includes a guard-ring portion along the edge of the liquid crystal display driver IC 200, a first straight portion, with a large line width, that extends in the up-down direction in FIG. 6, and a second straight portion, with a line width smaller than the first straight line, that extends in the left-right direction in FIG. 6. A data flip-flop FF5 is arranged near a place PT1 with the highest impedance with respect to the supply voltage terminal T1 within the supply voltage conductor pattern P1. This is because the place PT1 with the highest impedance is considered to be a place where the variation in the supply voltage VDD is largest and is most likely to cause external electric noise.

Also, variation in the ground voltage VSS can cause external electric noise, like the variation in the supply voltage VDD. Thus, a data flip-flop can be arranged near a place with the highest impedance with respect to the ground potential terminal T2 within a ground potential conductor pattern connected the ground potential terminal T2.

Unlike in this embodiment, only one data flip-flop may be provided.

<Second Decision Circuit>

Figure 7:
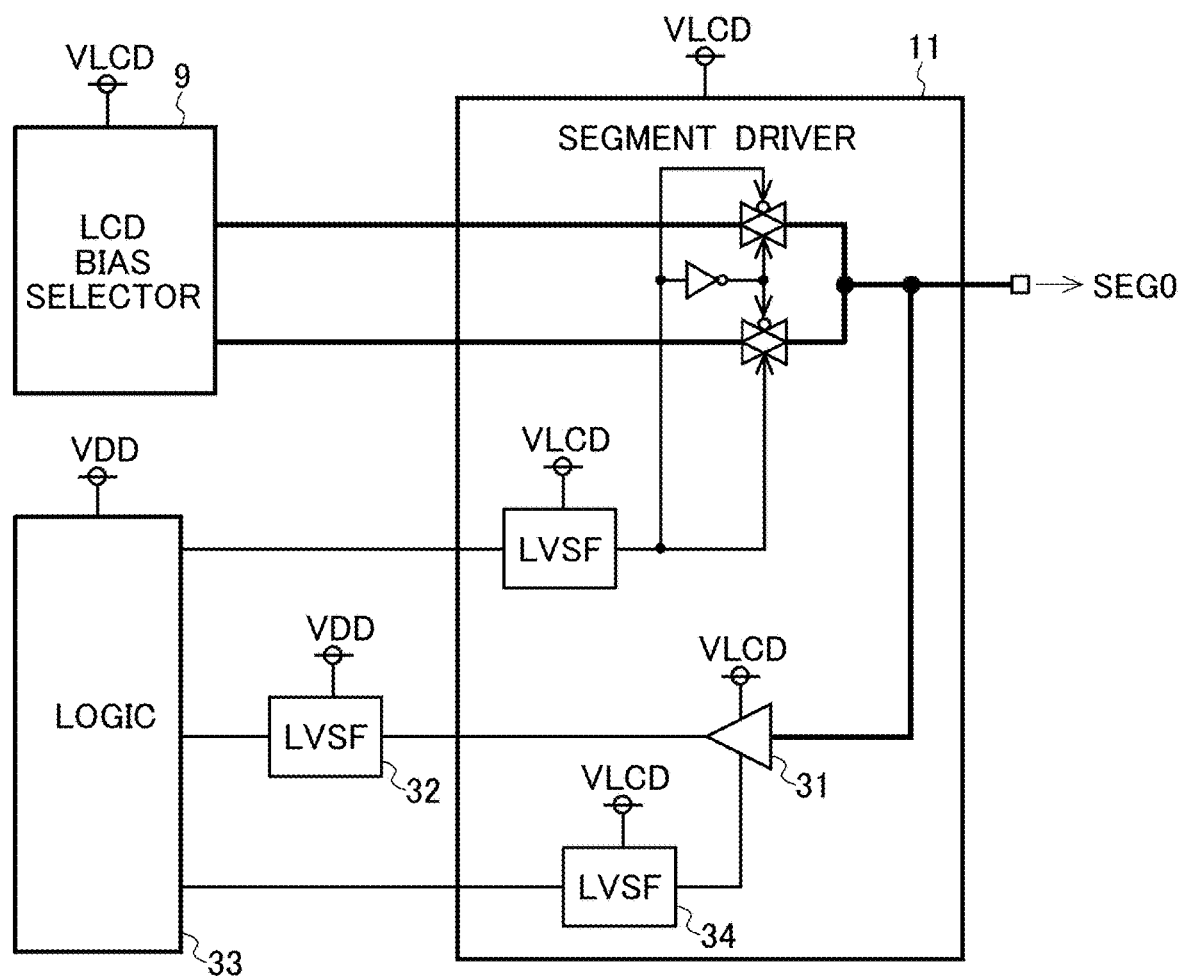
FIG. 7 is a diagram showing one configuration example of a second decision circuit.

FIG. 7 is a diagram showing one configuration example of a second decision circuit 22. The second decision circuit 22 is composed of a TTL (transistor-transistor logic) buffer 31, level shifters 32 and 34, and a logic circuit 33. In the configuration example shown in FIG. 7, the level shifters 32 and 34 are provided on the assumption that the supply voltage VDD and the constant voltage VLCD have different values; instead, when the supply voltage VDD and the constant voltage VLCD have the same value, it is possible to adopt a configuration in which no level shifters 32 and 34 are provided.

The logic circuit 33 constitutes part of the error signal output circuit 25. In FIG. 7, although only a part relating to the data signal SEG0 is shown, there are also parts relating to the data signals SEG1 to SEG9 and the scanning signals COM0 to COM3. The logic circuit 33 is common to all the data signals SEG0 to SEG9 and the scanning signals COM0 to COM3.

The logic circuit 33 outputs, only while controlling the data signal SEG0 between particular two values (for example, V1 and V4), an enable signal which keeps the TTL buffer 31 in an enabled state. The enable signal output from the logic circuit 33 is subjected to level shifting by the level shifter 34 and is then fed to the TTL buffer 31. The input terminal of the TTL buffer 31 is connected to a signal line outputting the data signal SEG0. The signal output from the TTL buffer 31 is subjected to level shifting by the level shifter 32 and is then fed to the logic circuit 33.

When a voltage corresponding to V1 returns from the level shifter 32 while controlling the data signal SEG0 to be at V1 and in addition a voltage corresponding to V4 returns from the level shifter 32 while controlling the data signal SEG0 to be at V4, the logic circuit 33 determines that a signal line transmitting the data signal SEG0 has no short circuit or the like with another signal line and that the level of the data signal SEG0 is a level commensurate with the output of the logic circuit 33.

The second decision circuit 22 shown in FIG. 7 performs determination by use of only particular two values (for example, V1 and V4) out of four-value voltages V1 to V4, and this results in a configuration that does not require A/D converters corresponding one to each of the four-value voltages V1 to V4; it is thus possible to reduce size and cost. The voltage generated by the liquid crystal voltage generator 8 is not limited to four-value voltages V1 to V4; it may be any voltages with two or more values.

<Third Decision Circuit>

The MPU 100 includes a checksum in the data transmitted to the serial interface 2 by serial bus communication. A third decision circuit 23 checks, by use of the checksum, whether or not there is any abnormality in the data transmitted to the serial interface 2 from the MPU 100 by serial bus communication.

<Fourth Decision Circuit>

A fourth decision circuit 24 outputs a pulse signal CHKO. The pulse signal CHKO may be, for example, a pulse signal of which the high level equals the value of the supply voltage VDD and of which the low level equals the value of the ground voltage VSS, or may be, for another example, a pulse signal of which the high level equals the value of the constant voltage VLCD and of which the low level equals the value of the ground voltage VSS. A terminal from which the pulse signal CHKO is output is connected to one end of a transparent electrode line formed on the glass substrate of the liquid crystal display panel 300. The fourth decision circuit 24 checks whether or not there is any breakage in the glass substrate of the liquid crystal display panel 300 by use of a pulse signal CHKI fed to a terminal connected to the other end of the transparent electrode line. When the pulse signal CHKI has any missing pulse, the fourth decision circuit 24 determines that there is a breakage in the glass substrate of the liquid crystal display panel 300.

<Error Signal Output Circuit>

Figure 8:
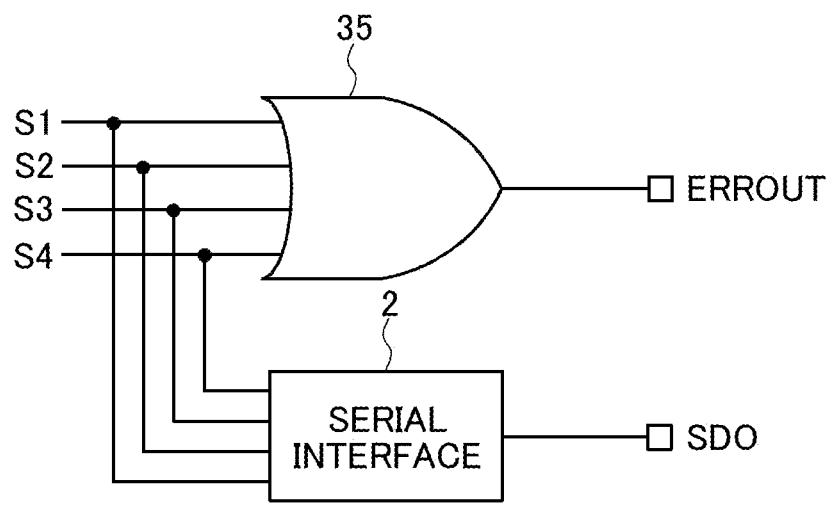
FIG. 8 is a diagram showing one configuration example of an error signal output circuit.

FIG. 8 is a diagram showing one configuration example of the error signal output circuit 25. The error signal output circuit 25 includes an OR circuit 35. In the configuration example shown in FIG. 8, part of the serial interface 2 function also as part of the error signal output circuit 25.

The first decision circuit 21, on determining that there is an abnormality, turns an output signal S1 to high level and, on determining that there is no abnormality, turns the output signal S1 to low level. The second decision circuit 22, on determining that there is an abnormality, turns an output signal S2 to high level and, on determining that there is no abnormality, turns the output signal S2 to low level. The third decision circuit 23, on determining that there is an abnormality, turns an output signal S3 to high level and, on determining that there is no abnormality, turns the output signal S3 to low level. The fourth decision circuit 24, on determining that there is an abnormality, turns an output signal S4 to high level and, and determining that there is no abnormality, turns the output signal S4 to low level.

The OR circuit 35 receives the output signals S1 to S4 of the first to fourth decision circuits 21 to 24 and outputs an error signal ERROUT, which is the OR of the output signals S1 to S4, to the MPU 100. The error signal ERROUT is a signal which indicates whether or not there is a factor causing an abnormality in screen display on the liquid crystal display panel 300. The error signal ERROUT, when it is determined that there is a factor causing an abnormality in screen display on the liquid crystal display panel 300, is turned to high level and, when it is determined that there is no factor causing an abnormality in screen display on the liquid crystal display panel 300, is turned to low level. Thus, when the error signal ERROUT is at high level, the MPU 100 can recognize that there is an abnormality. This permits the MPU 100 to take action such as by ceasing to output display data or by indicating abnormality when an abnormality occurs. As described above, the OR circuit 35 is provided so as to notify the MPU 100 that there is a factor causing an abnormality in screen display on the liquid crystal display panel 300 when it is determined that there is an abnormality in at least one of the first to fourth decision circuits 21 to 24. Thus, instead of the OR circuit 35, a circuit can be provided which differs from the OR circuit 35 in circuit configuration but which functions in a similar manner to the OR circuit 35. It is preferable that the determination function of the first to fourth decision circuits 21 to 24 be switchable between ON and OFF according to register settings respectively. When the decision function is OFF, for example, a decision circuit can, without performing determination, output an output signal indicating the determination that there is no abnormality.

The error signal output circuit 25 stores the states of the output signals S1 to S4 of the first to fourth decision circuits 21 to 24. When a read-out command relating to the states of the output signals S1 to S4 of the first to fourth decision circuits 21 to 24 is transmitted from the MPU 100, the serial interface 2 transmits to the MPU 100 the states of the output signals S1 to S4 of the first to fourth decision circuits 21 to 24.

<Determination of a State of COG Mounting>

Figure 9:
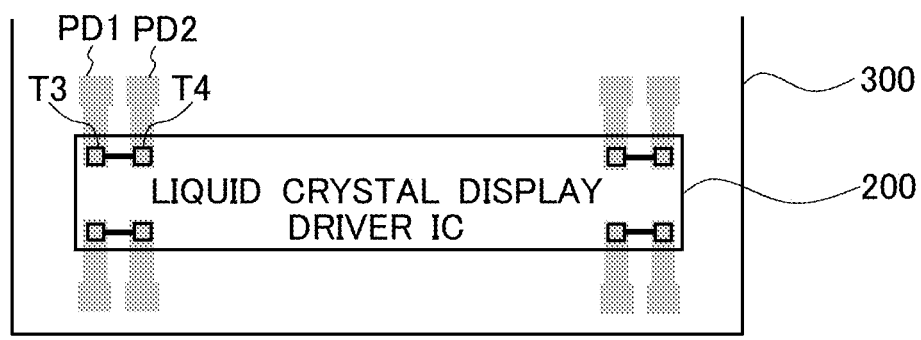
FIG. 9 is a partly transparent top view showing an outline of a liquid crystal display driver IC.

FIG. 9 is a partly transparent top view showing an outline of the liquid crystal display driver IC 200. In a corner part of the bottom face of the liquid crystal display driver IC 200, dummy terminals T3 and T4 are provided. The dummy terminals T3 and T4 are electrically connected together inside the liquid crystal display driver IC 200. Pads PD1 and PD2 are formed on a glass substrate of the display panel 300. A conductor having one end connected to the pad PD1 is formed on the glass substrate of the display panel 300, and when COG mounting is performed, the other end of the conductor is electrically connected to the dummy terminal T3. A conductor having one end connected to the pad PD2 is formed on the glass substrate of the display panel 300, and when COG mounting is performed, the other end of the conductor is electrically connected to the dummy terminal T4. Measuring the resistance value between the pads PD1 and PD2 makes it possible to determine whether COG mounting is proper or improper. It is preferable that, as shown in FIG. 9, the dummy terminals T3 and T4 be provided in each of the four corners of the bottom face of the liquid crystal display driver IC 200.

<Application>

Figure 10:
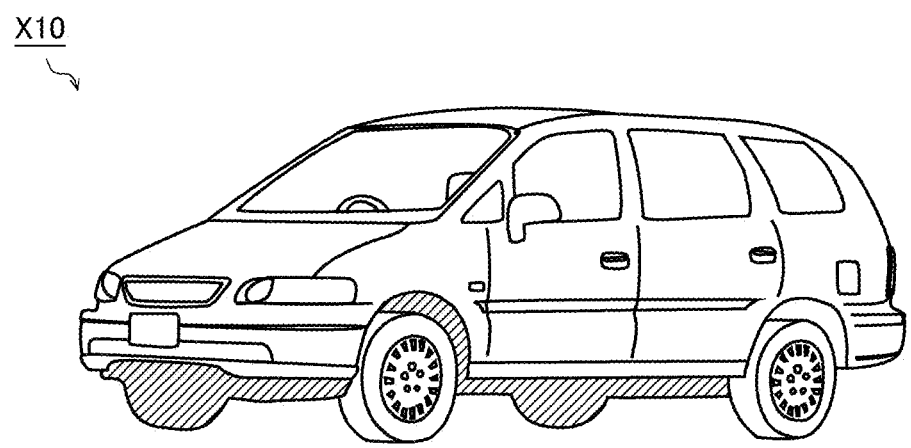
FIG. 10 is an exterior view of a vehicle having a display device.

The display device described above can be suitably used, for example, as part of an instrument panel arranged at a position where the driver of a vehicle X10 as shown in FIG. 10 can visually recognize it.

<Points to Note>

Various technical features disclosed herein can be implemented in any manner other than specifically described by way of embodiments above, and allow for many modifications within the spirit of the technical ingenuity involved. For example, in the embodiment described herein, the display device performs segment display; instead, the display device may perform matrix display. That is, it should be understood that the embodiment described herein are in every aspect illustrative and not restrictive, and that the technical scope of the present invention is defined not by the description of the embodiment given above but by the appended claims and encompasses any modification in the sense and scope equivalent to those of the claims.

LIST OF REFERENCE SIGNS 1 power-on reset circuit
2 serial interface
3 command data decoder
4 command register
5 display data RAM
6 oscillator
7 common counter
8 liquid crystal voltage generator
9 liquid crystal bias selector
10 common driver
11 segment driver
21 to 24 first to fourth decision circuits
25 error signal output circuit
31 TTL buffer
32, 34 level shifter
33 logic circuit
35 OR circuit
100 MPU
200 liquid crystal display driver IC
300 liquid crystal display panel
400 display unit
FF1 to FF5 data flip-flop
PD1, PD2 pad
T1 supply voltage terminal
T2 ground potential terminal
T3, T4 dummy terminal
X10 vehicle

The invention claimed is:

1. A display driver IC comprising:
a digital circuit including a logic circuit;
an output unit configured to output to outside a drive control signal having a level commensurate with an output of the logic circuit;
a first decision unit configured to check whether or not there is an abnormality in a register value of a register in the digital circuit;
a ground potential terminal connected to a ground potential; and
a ground potential conductor pattern connected to the ground potential terminal,
wherein the first decision unit includes at least one data flip-flop, and is configured to determine that there is an abnormality in the register value of the register in the digital circuit when a value written to the data flip-flop does not match a value read from the data flip-flop, and
the data flip-flop is provided near a place with a highest impedance with respect to the ground potential terminal within the ground potential conductor pattern.

2. The display driver IC according to claim 1, wherein a value written to the data flip-flop after the data flip-flop is reset is an inverted value of the value written to the data flip-flop before the data flip-flop is reset.

3. The display driver IC according to claim 1, wherein the display driver IC is in a rectangular shape in a plan view, and
the data flip-flop is provided in each of four corners of the rectangular shape.

4. The display driver IC according to claim 1, further comprising:
a supply voltage terminal to which a supply voltage is applied; and
a supply voltage conductor pattern connected to the supply voltage terminal,
wherein
the data flip-flop is provided near a place with a highest impedance with respect to the supply voltage terminal within the supply voltage conductor pattern.

5. The display driver IC according to claim 1, comprising:
a second decision unit configured to check whether or not a level of the drive control signal is a level commensurate with an output of the logic circuit,
wherein
the level commensurate with the output of the logic circuit has one of three or more values, and
the second decision unit is configured to sense the level of the drive control signal only when the level commensurate with the output of the logic circuit has one of particular two values to check whether or not the level of the drive control signal is a level commensurate with the output of the logic circuit.

6. The display driver IC according to claim 1, further comprising:
a third decision unit configured to check whether or not there is an abnormality in data that the logic circuit receives from outside; and
a fourth decision unit configured to check whether or not there is a breakage in a display panel to which the display driver IC is connected by COG mounting.

7. A display device comprising:
a host device;
the display driver IC according to claim 1 configured to receive data from the host device; and
a display panel configured to receive a drive control signal from the display driver IC.

8. A vehicle comprising the display device according to claim 7.

9. A display driver IC comprising:
a digital circuit including a logic circuit;
an output unit configured to output to outside a drive control signal having a level commensurate with an output of the logic circuit;
a first decision unit configured to check whether or not there is an abnormality in a register value of a register in the digital circuit;
a supply voltage terminal to which a supply voltage is applied; and
a supply voltage conductor pattern connected to the supply voltage terminal,
wherein
the first decision unit includes at least one data flip-flop, and is configured to determine that there is an abnormality in the register value of the register in the digital circuit when a value written to the data flip-flop does not match a value read from the data flip-flop, and
the data flip-flop is provided near a place with a highest impedance with respect to the supply voltage terminal within the supply voltage conductor pattern.

10. The display driver IC according to claim 9, wherein a value written to the data flip-flop after the data flip-flop is reset is an inverted value of the value written to the data flip-flop before the data flip-flop is reset.

11. The display driver IC according to claim 9, wherein the display driver IC is in a rectangular shape in a plan view, and
the data flip-flop is provided in each of four corners of the rectangular shape.

12. The display driver IC according to claim 9, comprising:
a second decision unit configured to check whether or not a level of the drive control signal is a level commensurate with an output of the logic circuit,
wherein
the level commensurate with the output of the logic circuit has one of three or more values, and
the second decision unit is configured to sense the level of the drive control signal only when the level commensurate with the output of the logic circuit has one of particular two values to check whether or not the level of the drive control signal is a level commensurate with the output of the logic circuit.

13. The display driver IC according to claim 9, further comprising:
a third decision unit configured to check whether or not there is an abnormality in data that the logic circuit receives from outside; and
a fourth decision unit configured to check whether or not there is a breakage in a display panel to which the display driver IC is connected by COG mounting.

14. A display device comprising:
a host device;
the display driver IC according to claim 9 configured to receive data from the host device; and
a display panel configured to receive a drive control signal from the display driver IC.

15. A vehicle comprising the display device according to claim 14.

* * * * *